(12) United States Patent
Su et al.

(10) Patent No.: US 12,446,181 B2
(45) Date of Patent: Oct. 14, 2025

(54) FAN MODULE

(71) Applicant: PLUME DESIGN, INC., Palo Alto, CA (US)

(72) Inventors: Ming-Tsung Su, Taipei (TW); Wang Chun Wen, Taoyuan (TW)

(73) Assignee: PLUME DESIGN, INC., Palo Alto, CA (US)

( * ) Notice: Subject to any disclaimer, the term of this patent is extended or adjusted under 35 U.S.C. 154(b) by 244 days.

(21) Appl. No.: 18/314,291

(22) Filed: May 9, 2023

(65) Prior Publication Data
US 2024/0381564 A1    Nov. 14, 2024

(51) Int. Cl.
*H05K 7/20* (2006.01)
*H05K 7/12* (2006.01)
*H05K 9/00* (2006.01)

(52) U.S. Cl.
CPC .......... *H05K 7/20136* (2013.01); *H05K 7/12* (2013.01); *H05K 7/20209* (2013.01); *H05K 9/0098* (2013.01)

(58) Field of Classification Search
CPC .. H05K 7/20136; H05K 7/20209; H05K 7/12; H05K 9/0098
See application file for complete search history.

(56) References Cited

U.S. PATENT DOCUMENTS

| | | | |
|---|---|---|---|
| 6,726,165 B2 * | 4/2004 | Sawayanagi | B60J 3/0217 248/224.8 |
| 11,417,953 B2 * | 8/2022 | Samardzija | H01R 12/716 |
| 2011/0085927 A1 | 4/2011 | Su | |
| 2012/0037762 A1 * | 2/2012 | Wu | H02G 3/22 248/65 |
| 2012/0170218 A1 | 7/2012 | Wang | |
| 2012/0257999 A1 | 10/2012 | Hsieh | |
| 2013/0010427 A1 * | 1/2013 | Lin | H01R 13/743 361/695 |
| 2013/0121830 A1 | 5/2013 | Lee | |
| 2015/0152873 A1 | 6/2015 | Lin et al. | |
| 2016/0010649 A1 | 1/2016 | Aiello | |
| 2016/0245306 A1 | 8/2016 | Berroth et al. | |
| 2023/0062807 A1 * | 3/2023 | Sun | H01R 13/24 |

OTHER PUBLICATIONS

International Search Report and Written Opinion to corresponding Int'l Appln. No. PCT/US24/28230, mailed Aug. 7, 2024 (11 pages).

* cited by examiner

*Primary Examiner* — Mukundbhai G Patel
(74) *Attorney, Agent, or Firm* — Nicholas Martin; Greenberg Traurig, LLP

(57) ABSTRACT

Disclosed is a system including a fan module and a flexible cable. The flexible cable has a first end and a second end. The flexible cable includes a first portion at the first end electrically connected to the fan module and a second portion that extends from the first portion towards the second end and includes one or more contact targets adjacent the second end. The one or more contact targets are configured to engage one or more respective connectors on a circuit board. The fan module may further include a housing and a fan. The housing includes a first member located at a first side, a second member located at a second side, and a slot defined by the first member and the second member. The flexible cable extends through the slot and perpendicularly extends to the second side of the housing to connect to the circuit board.

16 Claims, 4 Drawing Sheets

FAN MODULE

FIELD

The present disclosure relates to fan modules. More particularly, to electrical connections between a fan module and a fan controller.

BACKGROUND

Fan assemblies direct air onto or away from heat sources to prevent damage from occurring as a result of overheating. Such components can include, for example, electrical components that generate heat in response to an electrical current. The fan assembly typically includes a motor which drives a set of rotatable fan blades to rotate about a central axis to provide cooling capabilities. The fan assembly is controlled by a controller in electrically communicable connection with the motor via an electrical cable, which includes a connector at one or both ends that connect the fan assembly to the controller.

SUMMARY

Fan assemblies are typically connected to a fan controller or other electrical printed circuit board (PCB), which controls fan operation, via an electrical connector cable. The cable may include one or more electrical conductors that connect the fan assembly to the controller. In some embodiments, the electrical cable may be flexible cable (FFC), flexible printed cable (FPC), ribbon cable, or the like.

A design consideration when utilizing such fan assemblies is to reduce the total physical dimensions, thereby also reducing the area surrounding the connection interface. However, the dimension reduction can lead to certain challenges arising related to connecting the connector cable between the fan and the controller. Particularly, the connection and disconnection of the connector at the controller interface may be difficult for a user in view of the space limitations. Furthermore, as a result of vibrations from the rotation of the fan, the connection between the cable and the controller at the interface may eventually degrade.

Various embodiments of the present disclosure include system, apparatus, and devices that include a fan module and a flexible cable for connecting the fan module to a controller or other PCB. The flexible cable includes a first portion that connects to the fan module and a second portion that extends from the first portion and includes one or more contact targets. Accordingly, the one or more contact targets are configured to be placed in electrical connection with one or more respective connectors on the controller. As such, the controller may include a connection interface that includes the one or more connectors. In some embodiments, the one or more connectors may be a spring loaded connector. In other embodiments, the one or more connectors may be a pogo connector.

In some embodiments, the fan module may include a housing that is configured to the coupled to the controller, and where the one or more contact targets of the flexible cable is placed in connection engagement with the one or more respective connectors as a result of coupling the housing to the controller, as will be further described herein.

In some embodiments, a system includes a fan module and a flexible cable having a first end and a second end, the flexible cable includes a first portion located at the first end and electrically connected with the fan module, a second portion extending from the first portion and towards the second end, and one or more contact targets located adjacent the second end, the one or more contact targets configured to engage one or more respective connectors.

In some embodiments, the fan module includes a housing including a first member located at a first side, and a second member located at a second side, a slot defined by the first member and the second member, and a fan. In some embodiments, the fan is positioned between the first member and the second member of the housing and the fan is configured to rotate about a central axis.

In some embodiments, the second portion extends through the slot and substantially conforms to an outer periphery of housing to contact the one or more contact targets located adjacent the second end.

In some embodiments, the fan further includes a cylindrical body, and a set of fan blades, the set of fan blades extend from the cylindrical body in a radial direction.

In some embodiments, the system further includes a shielding member, the shielding member is positioned adjacent the slot of the housing to protect an exposed portion of the flexible cable from electromagnetic interference.

In some embodiments, the first member further includes a shielding portion, the shielding portion protects the first portion of the flexible cable from electromagnetic interference.

In some embodiments, the flexible cable includes a flexible printed circuit (FPC) cable.

In some embodiments, the one or more connectors include one or more spring loaded connectors.

In some embodiments, the one or more connectors include one or more pogo connectors.

In some embodiments, the system further includes a controller, the controller includes a printed circuit board (PCB) configured to control an operation of the fan module, the housing is configured to attach to the controller to enable the one or more connectors of the flexible cable to engage the one or more connectors arranged on the controller.

In some embodiments, an assembly includes a fan module including a housing including a first member located at a first side, and a second member located at a second side, a slot defined by the first member and the second member, a fan positioned between the first member and the second member of the housing and the fan is configured to rotate about a central axis, and a flexible cable having a first end and a second end, the flexible cable including a first portion located at the first end and electrically connected with the fan module, a second portion extending from the first portion and towards the second end, and one or more contact targets located adjacent the second end, the one or more contact targets configured to engage one or more respective connectors.

In some embodiments, the second portion extends through the slot and substantially conforms to an outer periphery of housing to contact the one or more contact targets located adjacent the second end.

In some embodiments, the assembly further includes a shielding member, the shielding member is positioned adjacent the slot of the housing to protect an exposed portion of the flexible cable from electromagnetic interference.

In some embodiments, the first member further includes a shielding portion, the shielding portion protects the first portion of the flexible cable from electromagnetic interference.

In some embodiments, the flexible cable includes a flexible printed circuit (FPC) cable.

In some embodiments, the one or more connectors include one or more spring loaded connectors.

In some embodiments, the one or more connectors include one or more pogo connectors.

In some embodiments, the assembly further includes a controller, the controller includes a printed circuit board (PCB) configured to control an operation of the fan module, the housing is configured to attach to the controller to enable the one or more connectors of the flexible cable to engage the one or more connectors arranged on the controller.

In some embodiments, a device includes a fan module including a housing including a first member located at a first side, a second member located at a second side, a slot defined by the first member and the second member, a fan positioned between the first member and the second member of the housing and the fan is configured to rotate about a central axis, a flexible cable having a first end and a second end, the flexible cable including a first portion located at the first end and electrically connected with the fan module, a second portion extending from the first portion and towards the second end, the second portion extends through the slot and substantially conforms to an outer periphery of housing to contact the one or more contact targets located adjacent the second end, and one or more contact targets located adjacent the second end, the one or more contact targets configured to engage one or more respective connectors, and a controller, the controller includes a printed circuit board (PCB) configured to control an operation of the fan module, the housing is configured to attach to the controller to enable the one or more connectors of the flexible cable to engage the one or more connectors arranged on the controller.

In some embodiments, the device, further includes a shielding member, the shielding member is positioned adjacent the slot of the housing to protect an exposed portion of the flexible cable from electromagnetic interference, and the first member further includes: a shielding portion, the shielding portion protects the first portion of the flexible cable from electromagnetic interference.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Figure 1:
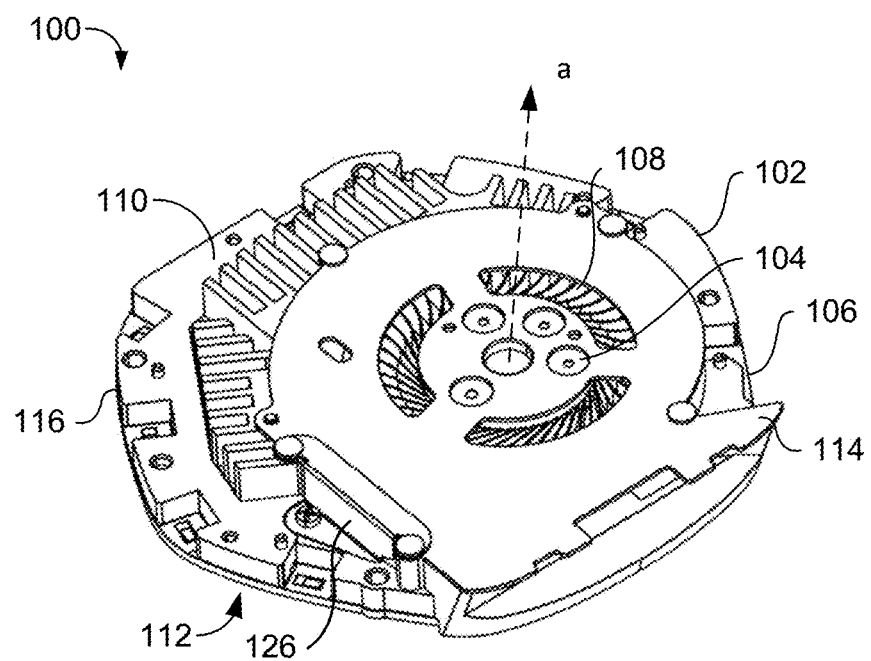
FIG. 1 shows a perspective view of a system, according to some embodiments of the present disclosure.

FIG. 1 is a perspective view of a system 100, according to some embodiments.

The system 100 includes a fan module 102 and a flexible cable 104. The fan module 102 includes a housing 106 and a fan 108. The housing 106 having a first side 110 and a second side 112 opposite the first side 110. The housing 106 includes a first member 114 at the first side 110 and a second member 116 at the second side 112. The first member 114 and the second member 116 define a cylindrically shaped opening between the first member 114 and second member 116 and where the fan 108 is positioned. In some embodiments, the first member 114 and the second member 116 may form a slot 118 where the first member 114 meets the second member 116 and the flexible cable 104 extends through the slot 118 to connect to a fan controller or other PCB, as will be further described herein.

In some embodiments, each of the first member 114 and second member 116 may be fastened to the other and may include receptacles for receiving a fastener to connect the first member 114 to the second member 116. The one or more fasteners may include any of a plurality of fasteners including, but not limited to, screws, nuts, bolts, rivets, anchors, clips, brackets, spacers, clamps, adhesives, other fastening members, or any combinations thereof, which enable the first member 114 to be fixedly attached to the second member 116. Additionally, in some embodiments, the housing 106 may also be coupled to the fan controller or other PCB, as will be further described herein.

In some embodiments, each of the first member 114 and second member 116 may include one or more apertures to enable cooling air to be directed through the housing in one or both directions. For example, the fan 108 may direct cooling air through one or more apertures located at the first member 114 and onto an external component to enable the system 100 to provide cooling capabilities to the component. It is to be appreciated by those having ordinary skill in the art that the features of the housing 106 is not intended to be limiting and the system 100 and the housing 106 may include other features not described herein.

The fan 108 is a rotatable member that is configured to rotate about a central axis a. In some embodiments, each of the first member 114 and second member 116 include protrusions located on a respective interior surface of the housing 106 that are configured to retain a relative position of the fan 108 while allowing the movable parts of the fan 108 to rotate about the central axis a. As will be shown in FIG. 2, the fan 108 includes a body 120 and a set of fan blades 122. In this regard, in some embodiments, the protrusions may be configured to engage a portion of the body 120 having corresponding dimensions to enable the body 120 to be fixedly retained between the first member 114 and second member 116 of the housing 106 while allowing the set of fan blades 122 to rotate about the body 120 to provide the cooling capabilities to the fan controller and/or to an external component.

It is to be appreciated by those having ordinary skill in the art that the components of the fan 108 are not intended to be limiting and may include other components that may not be described herein. For example, in some embodiments, the fan 108 may include a motor 124 mechanically coupled to the set of fan blades 122 and which drives the rotation of the set of fan blades 122 about the body 120 and the central axis a. Accordingly, as the fan 108 and, particularly, the set of fan blades 122 rotate, cooling air is directed through the housing 106 to enable the fan module 102 to direct the air onto or away from one or more sources of heat. For example, the fan module 102 may direct air onto a PCB to provide cooling air to the electrical components on the PCB.

In some embodiments, the system 100 may further include a shielding member 126. The shielding member 126 is positioned on an external surface of the housing 106 adjacent the slot 118. As such, the shielding member 126 is configured to cover an exposed section of the flexible cable 104 that extends from the slot 118 and is external to the housing 106 on the first side 110 to protect the flexible cable 104 from electrostatic interference. In some embodiments, the first member 114 may be made of materials that enables the first member 114 to also serve as a shielding member. In some embodiments, the first member 114 may cover an end of the flexible cable 104 that connects to the fan 108, as will be further described herein, such as to protect that portion of the flexible cable 104 from electrostatic interference.

Figure 2:
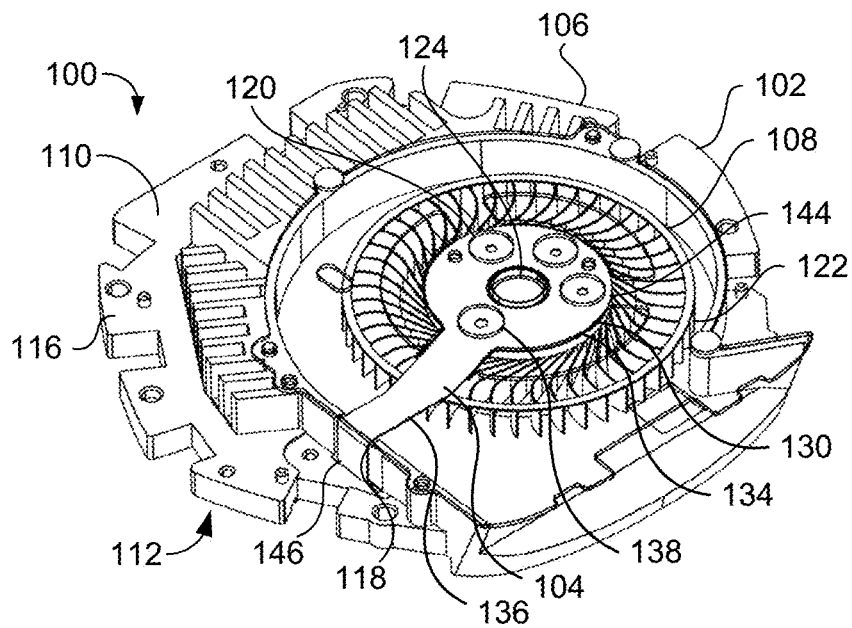
FIG. 2 shows a partially exposed perspective view of the system, according to some embodiments of the present disclosure.
Figure 3:
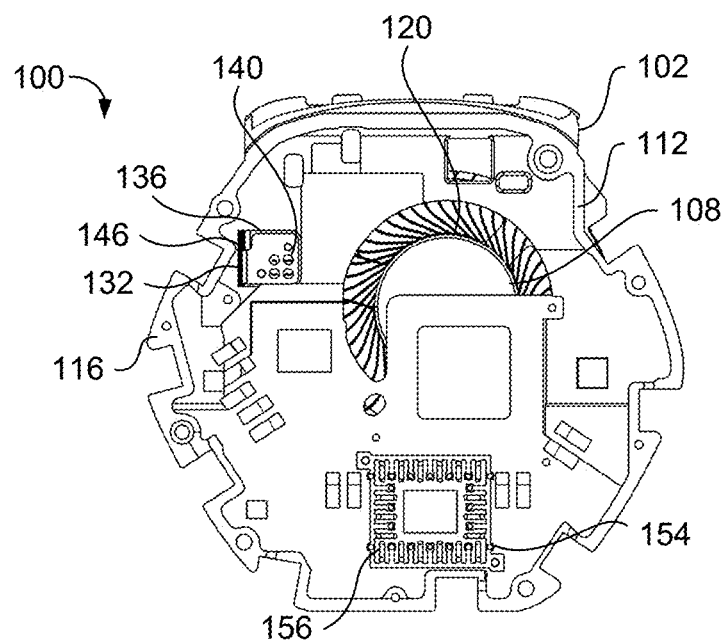
FIG. 3 shows a bottom perspective view of the system, according to some embodiments of the present disclosure.

FIG. 2 shows a partially exposed perspective view of the system 100, according to some embodiments. FIG. 3 shows a bottom perspective view of the system 100, according to some embodiments. Unless specifically referenced, FIGS. 2 and 3 will be described collectively.

The system 100 includes a flexible cable 104. The flexible cable 104 has a first end 130 and a second end 132 opposite the first end 130. The flexible cable 104 includes a first portion 134 and a second portion 136. The first portion 134 is located at the first end 130 and is configured to be placed in electrical connection with the fan module 102. For example, in some embodiments, the first portion 134 may include one or more electrical contacts 138 located therein that are configured to be placed in electrical connection with one or more electrodes on the fan 108. In this regard, in some embodiments, the fan 108 may further include one or more terminals located adjacent the first side 110 that are configured to connect to the one or more electrical contacts 138 of the flexible cable 104. The flexible cable 104 is thereby connected to the fan module 102 when the flexible cable 104 is installed into the housing 106 and positioned between the fan 108 and the first member 114 such as to enable the one or more electrical contacts to engage and be placed in electrical connection with the one or more terminals of the fan 108.

The second portion 136 extends from the first portion 134 and towards the second end 132. Additionally, the flexible cable 104 includes one or more contact targets 140 adjacent the second end 132. The one or more contact targets 140 are configured to engage corresponding connectors on the fan controller or on the PCB, as will be further described herein. In some embodiments, the flexible cable 104 includes a plurality electrical conductors 142 that extend between the first end 130 and the second end 132. In some embodiments, each of the one or more contact targets 140 may be in electrical connection with an electrical conductor 142 that is also in electrical connection with a corresponding one of the one or more electrical contacts 138 at the first portion 134. In this regard, each electrical conductor 142 is connected to a respective one of the one or more electrical contacts 138 and a respective one of the one or more contact targets 140 to enable the fan module 102 to be controlled by the fan controller for providing the cooling capabilities to an external component. In some embodiments, the flexible cable 104 may be a flexible cable (FFC), flexible printed circuit (FPC) cable, ribbon cable, other like cable, or any combinations thereof. However, it is to be appreciated that the cable type of the flexible cable 104 is not intended to be limiting and may include any of a plurality of different electrical connector cables in accordance with this disclosure.

In some embodiments, the fan module 102 may include a PCB 144 located adjacent the first side 110 between the fan 108 and the first member 114 and the one or more electrical contacts 138 of the first portion 134 of the flexible cable 104 may be connected to the PCB 144.

The housing 106 and/or the first member 114 and the second member 116 may define slot 118 which extends through a sidewall of the housing 106 and thereby places the interior cavity defined by the housing 106 in fluid communication with the exterior. The flexible cable 104 may extend through the slot 118 and perpendicularly extends towards the second side 112 of the housing 106.

Referring to FIG. 3, the second member 116 may further include a second slot 146 which extends through the second member 116 towards the second side 112. As such, the flexible cable 104 may perpendicularly extend from slot 118 and extend through second slot 146. Additionally, the flexible cable 104 may extend through the second slot 146 and the flexible cable 104 may then again extend in a perpendicular direction at the second slot 146 such as to be parallel to a plane of the second side 112 of the second member 116.

In this regard, the flexible cable 104 may perpendicularly extend from second slot 146, and the flexible cable 104 may include one or more contact targets 140 adjacent the second end 132 that are externally facing in the outward direction to enable the flexible cable 104 to be placed in electrical connection with the connection interface 150 of a controller 148 when the controller 148 is coupled to the housing 106, as will be further described herein. Additionally, in some embodiments, the flexible cable 104 may form a U-shape to enable the flexible cable 104 to connect to the terminals on the fan 108 at the first end 130 and to connect to the connection interface 150 of the controller 148 at the second end 132. However, it is to be appreciated by those having ordinary skill in the art that the shape of the flexible cable 104 is not intended to be limiting and the flexible cable 104 may include any of a plurality of shapes and dimensions to enable the flexible cable 104 to be placed in electrical connection with the fan 108 at the first end 130 and to be placed in electrical connection with the connection interface 150 at the second end 132.

Figure 4:
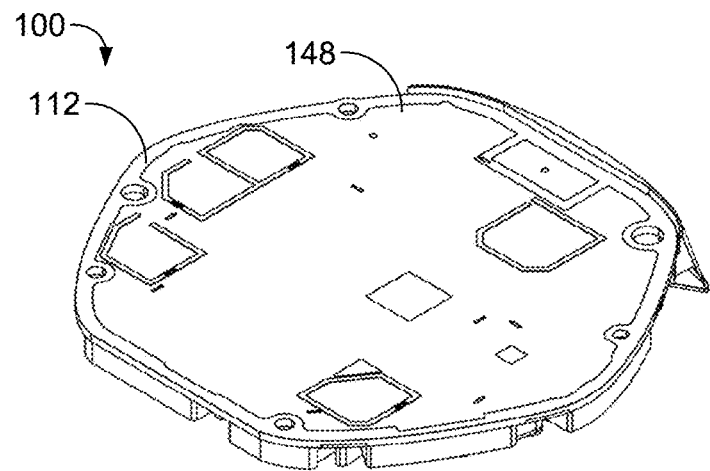
FIG. 4 illustrates a bottom view of the system, according to some embodiments of the present disclosure.

Also referring to FIG. 3, the system 100 may further include one or more spacers 154 arranged on the second side 112 of the housing 106. The one or more spacers 154 are configured to be positioned between the housing 106 and a PCB coupled to the housing 106, such as controller 148 as shown in FIG. 4. The one or more spacers 154 maintain a gap between the housing 106 and the fan 108 to enable one or more components of the system 100, such as the flexible cable 104, to be positioned between the housing 106 and controller 148. Accordingly, the one or more spacers 154 may reduce a likelihood of damage to the components located between the housing 106 and the PCB in connection with the fan module 102, including the components of the PCB, such as the connection interface 150 on the controller 148. In some embodiments, each of the one or more spacers 154 may further include a plurality of tensioning members 156 that apply a tension force between the second member 116 and the PCB coupled to the housing 106 at the second side 112.

Figure 5:
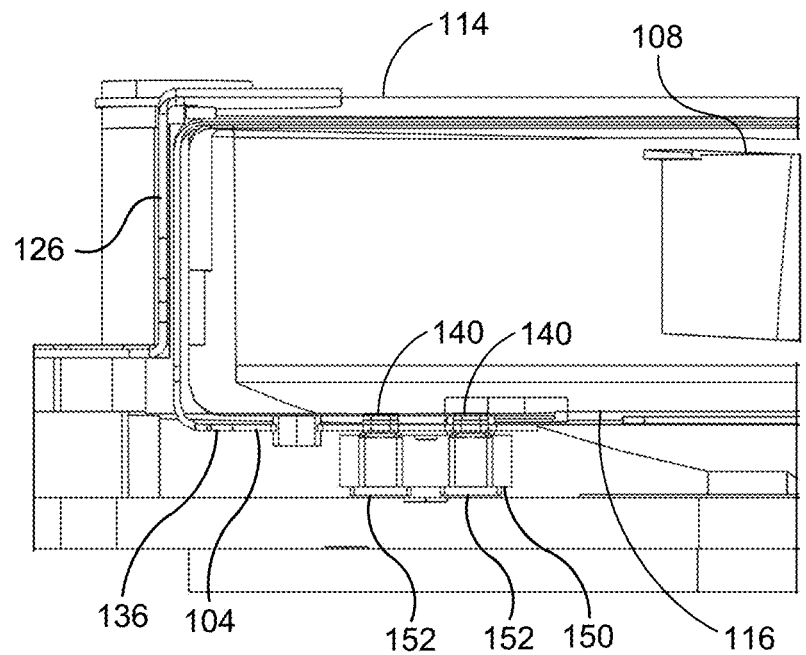
FIG. 5 illustrates a partially exposed side view of the system, according to some embodiments of the present disclosure.

FIG. 4 illustrates a bottom view of the system 100, according to some embodiments. FIG. 5 illustrates a partially exposed side view of the 100, according to some embodiments. Unless specifically referenced, FIGS. 4 and 5 will be described collectively.

The system 100 may further include controller 148. The controller 148 may be a PCB including one or more components located on the circuit board. The controller 148 may include a processor and a non-transitory computer readable medium having stored thereon one or more instructions that are executable by the processor to enable the system 100 to perform one or more operations in accordance with the present disclosure. For example, the one or more instructions may be configured to control the operation of the fan module 102 to provide cooling capabilities or air circulation to an external component or device. The controller 148 may be attached (e.g., coupled) to the housing 106 at the second side 112 by one or more fasteners.

The controller 148 may include a connection interface 150 having one or more connectors 152. Each of the one or more connectors 152 on the connection interface 150 are configured to electrically connect with a corresponding one of the one or more contact targets 140 of the flexible cable 104. Accordingly, when mounting the controller 148 onto the second side 112 of the housing 106, the one or more connectors 152 of the connection interface 150 may extend towards the one or more contact targets 140 of the flexible cable 104 and engage a respective one of the one or more contact targets 140 to place the controller 148 in electrical communicable connection with the fan module 102 and to enable the controller 148 to control the operation of the fan module 102. As such, the connection interface 150 may be positioned on the controller 148 such that when mounting the controller 148 to the housing 106, each of the one or more contact targets 140 of the flexible cable 104 may be in colinear alignment with a respective one of the one or more connectors 152 of the connection interface 150. Furthermore, the coupling of the controller 148 to the housing 106 is simplified and the connected engagement between the flexible cable 104 and the connection interface 150 is also simplified such that a user connecting the flexible cable 104 to the controller 148 at the connection interface 150 is capable of doing so efficiently and quickly without having to physically insert the flexible cable 104 into a receptacle at a terminal.

Figure 6:
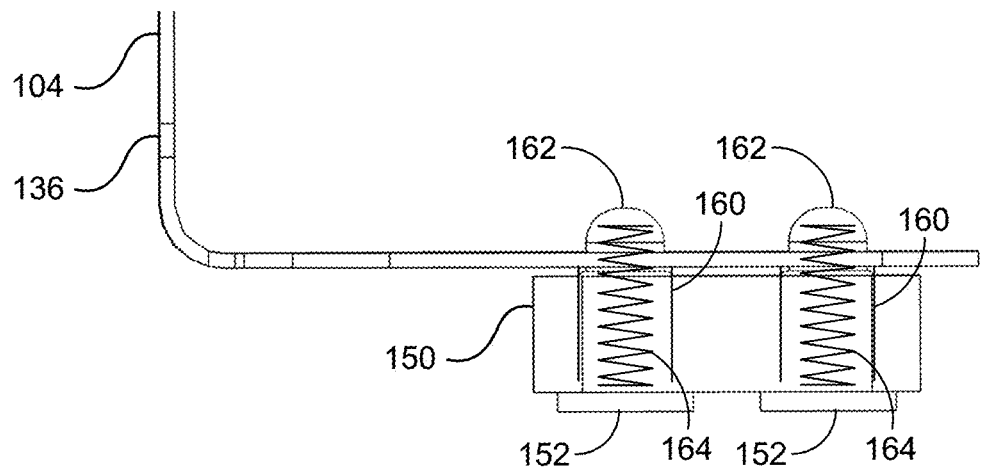
FIG. 6 illustrates a partial side view of the system, according to some embodiments of the present disclosure.

FIG. 6 illustrates a partial side view of the system 100, according to some embodiments.

In some embodiments, the connection interface 150 may include one or more connectors 152. In some embodiments, the one or more connectors 152 may be a spring loaded connector. Each of the one or more connectors 152 of the connection interface 150 may include a barrel 160, a plunger 162, and a spring member 164. The barrel 160 includes a first cylindrical portion and the plunger 162 includes a second cylindrical portion. The second cylindrical portion of the plunger 162 is located in the first cylindrical portion and is tensioned by the spring member 164 such that the plunger 162 is fully extended in the normal position and the plunger 162 slidably retracts into the interior portion of the barrel 160 as the spring member 164 compresses in response to the plunger 162 contacting a mating connection.

In some embodiments, the spring member 164 may be a helical spring. The spring member 164 applies a constant normal force between the plunger and barrel, which is applied to the contact target or mating receptacle that is in electrical connection with the respective one or more connectors 152. In this regard, the force applied by the spring member 164 counteracts any movement, such as caused by vibration from the rotation of the fan module 102, which may affect the connection between the controller 148 and the fan module 102 at the connection interface 150. In some embodiments, the one or more connectors 152 may be a pogo connector.

Figure 7:
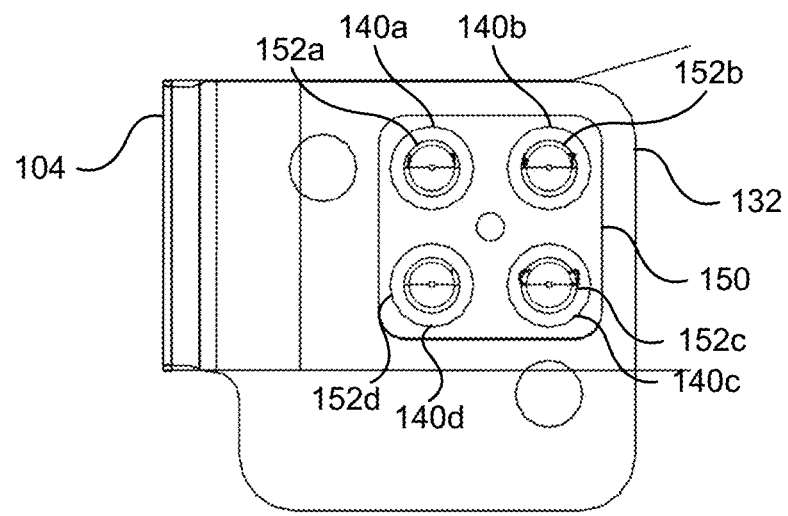
FIG. 7 illustrates a partial top view of the system, according to some embodiments of the present disclosure.

FIG. 7 illustrates a partial top view of the system 100, according to some embodiments.

The connection interface 150 includes one or more connectors 152. As shown in FIG. 7, the connection interface 150 includes connector 152a, connector 152b, connector 152c, and connector 152d, collectively referred to as connectors 152. In some embodiments, the connection interface 150 may include one connector. In some embodiments, the connection interface 150 may include two connectors. In some embodiments, the connection interface 150 may include three connectors. In some embodiments, the connection interface 150 may include four connectors. In some embodiments, the connection interface 150 may include four or more connectors.

Each of the connectors 152 on the connection interface 150 is configured to matingly connect to a respective one of the contact targets 140 on the flexible cable 104. In this regard, the flexible cable 104 includes contact target 140a, contact target 140b, contact target 140c, and contact target 140d, collectively referred to as contact targets 140. In some embodiments, the flexible cable 104 may include one contact target. In some embodiments, the flexible cable 104 may include one contact targets. In some embodiments, the flexible cable 104 may include three contact targets. In some embodiments, the flexible cable 104 may include four contact targets. In some embodiments, the flexible cable 104 may include four or more contact targets.

The one or more connectors 152 on the connection interface 150 perpendicularly extend from the controller 148 towards the second side 112 of the housing 106 at the second member 116. Additionally, the flexible cable 104 extends in a direction that is substantially perpendicular to the direction that each of the one or more connectors 152 extend towards the housing 106. Accordingly, the second portion 136 of the flexible cable 104 may include a first bend and a second bend. The first bend may be located adjacent the slot 118 where the flexible cable 104 extends from the interior cavity of the housing 106. The first bend enables the flexible cable 104 to conform to the exterior surface of the housing 106 formed by a sidewall of the second member 116 adjacent the first side 110. The second bend may be located adjacent the second slot 146 at the second side 112. The second bend enables the flexible cable 104 to conform to the exterior surface of the housing 106 at the second side 112 and to enable the connection interface 150 to engage the one or more contact targets 140 of the flexible cable 104.

In this regard, the one or more connectors 152 may extend towards the one or more contact targets 140 in a direction perpendicular to a plane of the flexible cable 104 at the second end 132 to enable the one or more connectors 152 to matingly engage the one or more contact targets 140 on the flexible cable 104. In some embodiments, the housing 106 may include one or more tabs located on the second side 112 of the second member 116 which retain a position of the second end of the flexible cable 104 such that the connection interface 150 may positively engage the one or more contact targets 140 without bending or crimping the flexible cable 104.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

As used herein "embedded" means that a first material is distributed throughout a second material.

What is claimed is:

1. A system comprising:
    a fan module, the fan module comprising:
        a housing comprising:
            a first member located at a first side, the first member comprising a shielding portion, wherein the shielding portion protects a first portion of a flexible cable from electromagnetic interference, and
            a second member located at a second side,
            a slot defined by the first member and the second member;
        a fan,
            wherein the fan is positioned between the first member and the second member of the housing and the fan is configured to rotate about a central axis; and
        the flexible cable having a first end and a second end, the flexible cable comprising:
            the first portion located at the first end and electrically connected with the fan module,
            a second portion extending from the first portion and towards the second end, and
            one or more contact targets located adjacent the second end,
                wherein the one or more contact targets are configured to engage one or more respective connectors.

2. The system of claim 1, wherein the second portion extends through the slot and substantially conforms to an outer periphery of housing to contact the one or more contact targets located adjacent the second end.

3. The system of claim 1, wherein the fan further comprises:
    a cylindrical body, and
    a set of fan blades,
        wherein the set of fan blades extend from the cylindrical body in a radial direction.

4. The system of claim 1, further comprising:
    a shielding member,
        wherein the shielding member is positioned adjacent the slot of the housing to protect an exposed portion of the flexible cable from electromagnetic interference.

5. The system of claim 1, wherein the flexible cable comprises a flexible printed circuit (FPC) cable.

6. The system of claim 1, wherein the one or more connectors comprise one or more spring loaded connectors.

7. The system of claim 1, wherein the one or more connectors comprise one or more pogo connectors.

8. The system of claim 1, further comprising:
    a controller,
        wherein the controller comprises a printed circuit board (PCB) configured to control an operation of the fan module;
    wherein the housing is configured to attach to the controller to enable the one or more connectors of the flexible cable to engage the one or more connectors arranged on the controller.

9. An assembly comprising:
    a fan module comprising:
        a housing comprising:
            a first member located at a first side, and
            a second member located at a second side,
            a slot defined by the first member and the second member;
        a fan,
            wherein the fan is positioned between the first member and the second member of the housing and the fan is configured to rotate about a central axis;
        a flexible cable having a first end and a second end, the flexible cable comprising:
            a first portion located at the first end and electrically connected with the fan module,
            a second portion extending from the first portion and towards the second end, and
            one or more contact targets located adjacent the second end,
                wherein the one or more contact targets and configured to engage one or more respective connectors; and
        a shielding member,
            wherein the shielding member is positioned adjacent the slot of the housing to protect an exposed portion of the flexible cable from electromagnetic interference.

10. The assembly of claim 9, wherein the second portion extends through the slot and substantially conforms to an outer periphery of housing to contact the one or more contact targets located adjacent the second end.

11. The assembly of claim 9, wherein the first member further comprises:
   a shielding portion,
      wherein the shielding portion protects the first portion of the flexible cable from electromagnetic interference.

12. The assembly of claim 9, wherein the flexible cable comprises a flexible printed circuit (FPC) cable.

13. The assembly of claim 9, wherein the one or more connectors comprise one or more spring loaded connectors.

14. The assembly of claim 9, wherein the one or more connectors comprise one or more pogo connectors.

15. The assembly of claim 9, further comprising:
   a controller,
      wherein the controller comprises a printed circuit board (PCB) configured to control an operation of the fan module;
   wherein the housing is configured to attach to the controller to enable the one or more connectors of the flexible cable to engage the one or more connectors arranged on the controller.

16. A device comprising:
   a fan module comprising:
      a housing comprising:
         a first member located at a first side, the first member comprising a shielding portion, wherein the shielding portion protects a first portion of a flexible cable from electromagnetic interference, and
         a second member located at a second side,
         a slot defined by the first member and the second member;
      a fan,
         wherein the fan is positioned between the first member and the second member of the housing and the fan is configured to rotate about a central axis;
      a flexible cable having a first end and a second end, the flexible cable comprising:
         a first portion located at the first end and electrically connected with the fan module,
         a second portion extending from the first portion and towards the second end,
            wherein the second portion extends through the slot and substantially conforms to an outer periphery of housing to contact the one or more contact targets located adjacent the second end, and
      one or more contact targets located adjacent the second end,
         wherein the one or more contact targets and configured to engage one or more respective connectors;
   a shielding member,
      wherein the shielding member is positioned adjacent the slot of the housing to protect an exposed portion of the flexible cable from electromagnetic interference; and
   a controller,
      wherein the controller comprises a printed circuit board (PCB) configured to control an operation of the fan module;
   wherein the housing is configured to attach to the controller to enable the one or more connectors of the flexible cable to engage the one or more connectors arranged on the controller.

* * * * *